United States Patent
Lin et al.

(10) Patent No.: US 9,216,908 B2
(45) Date of Patent: Dec. 22, 2015

(54) METHOD FOR MAKING STRIP SHAPED GRAPHENE LAYER

(71) Applicants: Tsinghua University, Beijing (CN); HON HAI PRECISION INDUSTRY CO., LTD., New Taipei (TW)

(72) Inventors: Xiao-Yang Lin, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 457 days.

(21) Appl. No.: 13/730,860

(22) Filed: Dec. 29, 2012

(65) Prior Publication Data

US 2013/0264011 A1  Oct. 10, 2013

(51) Int. Cl.
*C01B 31/04* (2006.01)
*B82Y 30/00* (2011.01)
*B82Y 40/00* (2011.01)

(52) U.S. Cl.
CPC ............ *C01B 31/0438* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| 2010/0124622 A1 | 5/2010 | Wang et al. |
| 2010/0323113 A1 | 12/2010 | Ramappa et al. |
| 2010/0327956 A1 | 12/2010 | Karkkainen et al. |

FOREIGN PATENT DOCUMENTS

TW  201100324  1/2011

OTHER PUBLICATIONS

Dacheng Wei et al.; "Scalable synthesis of few-layer graphene ribbons with controlled morphologies by a template method and their applications in nanoelectromechanical switches"; J. Am. Chem. Soc., vol. 131, p. 11147-11154, Jul. 20, 2009.
A.Fasoli et al.; "Fabrication of grapheme nanoribbons via nanowire lithography"; Phys. Status Solidi B, vol. 246, No. 11-12, p. 2514-2517, Oct. 29, 2009.

*Primary Examiner* — Joel Horning
(74) *Attorney, Agent, or Firm* — Novak Druce Connolly Bove + Quigg LLP (57) ABSTRACT

A method for making a strip shaped graphene layer includes the following steps. First, a graphene film is located on a surface of a substrate is provided. Second, a carbon nanotube structure is disposed on the graphene film. The carbon nanotube structure includes a plurality of carbon nanotube segments and a number of strip-shaped gaps between the adjacent carbon nanotube segments. Third, the graphene film exposed by the strip-shaped gaps is removed by applying a voltage to the carbon nanotube segments and heating the substrate.

20 Claims, 8 Drawing Sheets

METHOD FOR MAKING STRIP SHAPED GRAPHENE LAYER

CROSS-REFERENCE TO RELATED APPLICATIONS

This application claims all benefits accruing under 35 U.S.C. §119 from China Patent Application No. 201210096864.9, filed on Apr. 5, 2012, in the China Intellectual Property Office, the contents of which are hereby incorporated by reference.

BACKGROUND

1. Technical Field

The present disclosure relates to a method for making stripe graphene layer.

2. Description of Related Art

Graphene is an allotrope of carbon with a structure of one-atom-thick planar sheets of $sp^2$-bonded carbon atoms that are densely packed in a honeycomb crystal lattice. Graphene can be most easily visualized as an atomic-scale chicken wire made of carbon atoms and their bonds. The crystalline or "flake" form of graphite consists of many graphene sheets stacked together.

The carbon-carbon bond length in graphene is about 0.142 nanometers. Graphene sheets stack to form graphite with an interplanar spacing of about 0.335 nanometers. Graphene is a basic structural element of some carbon allotropes including graphite, charcoal, carbon nanotubes and fullerenes. It can also be considered as an indefinitely large aromatic molecule, the limiting case of the family of flat polycyclic aromatic hydrocarbons.

Graphene has excellent electrical and thermal properties. An electron mobility of graphene at room temperature is about 15000 $cm^2V^{-1}s^{-1}$. A thermal conductivity of the graphene is about 3000 $Wm^{-1}K^{-1}$. Graphene can be used on the semiconductor devices, such as, sensors, transistors, solar cells, thin film transistors, and so on. In such applications, a stripe graphene layer is needed.

What is needed, therefore, is to provide a method for making a strip shaped graphene layer.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
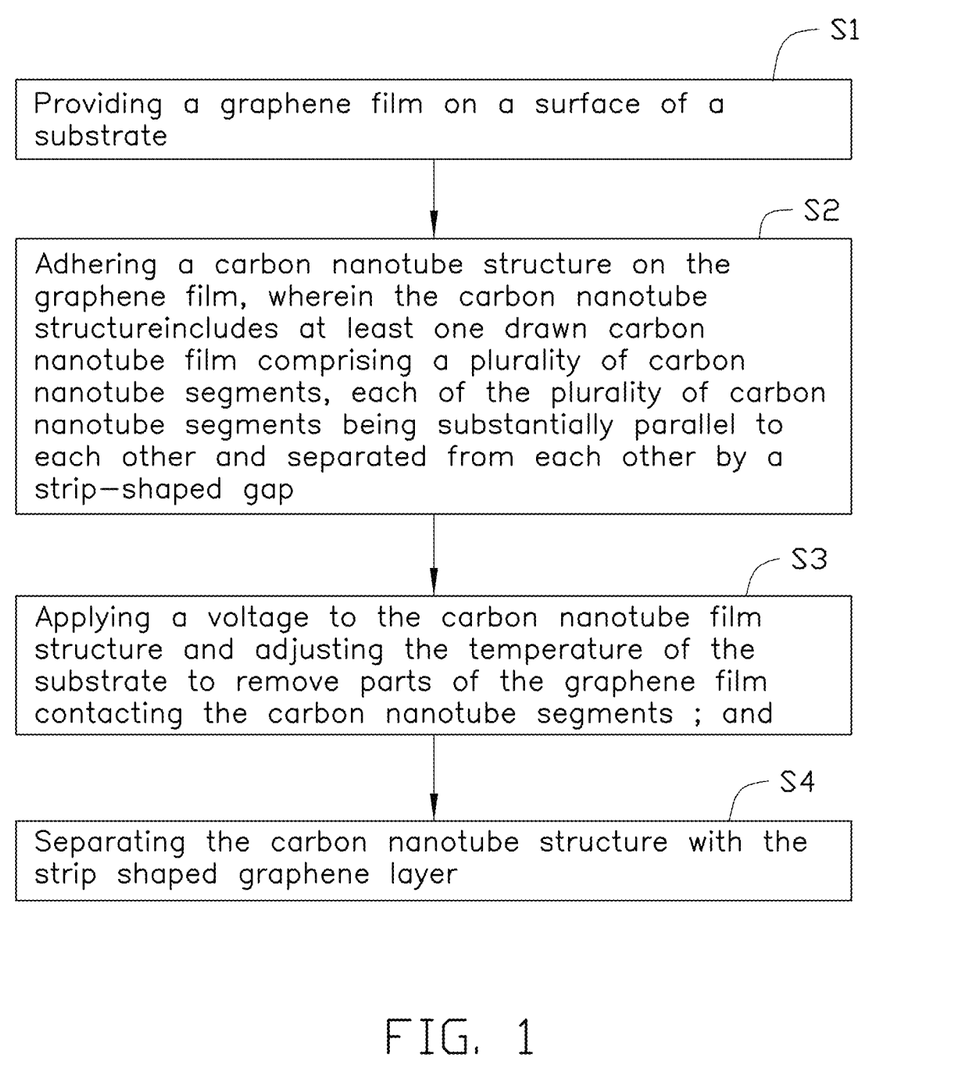
FIG. 1 shows a flowchart of one embodiment of a method for making a strip shaped graphene layer.
Figure 2:
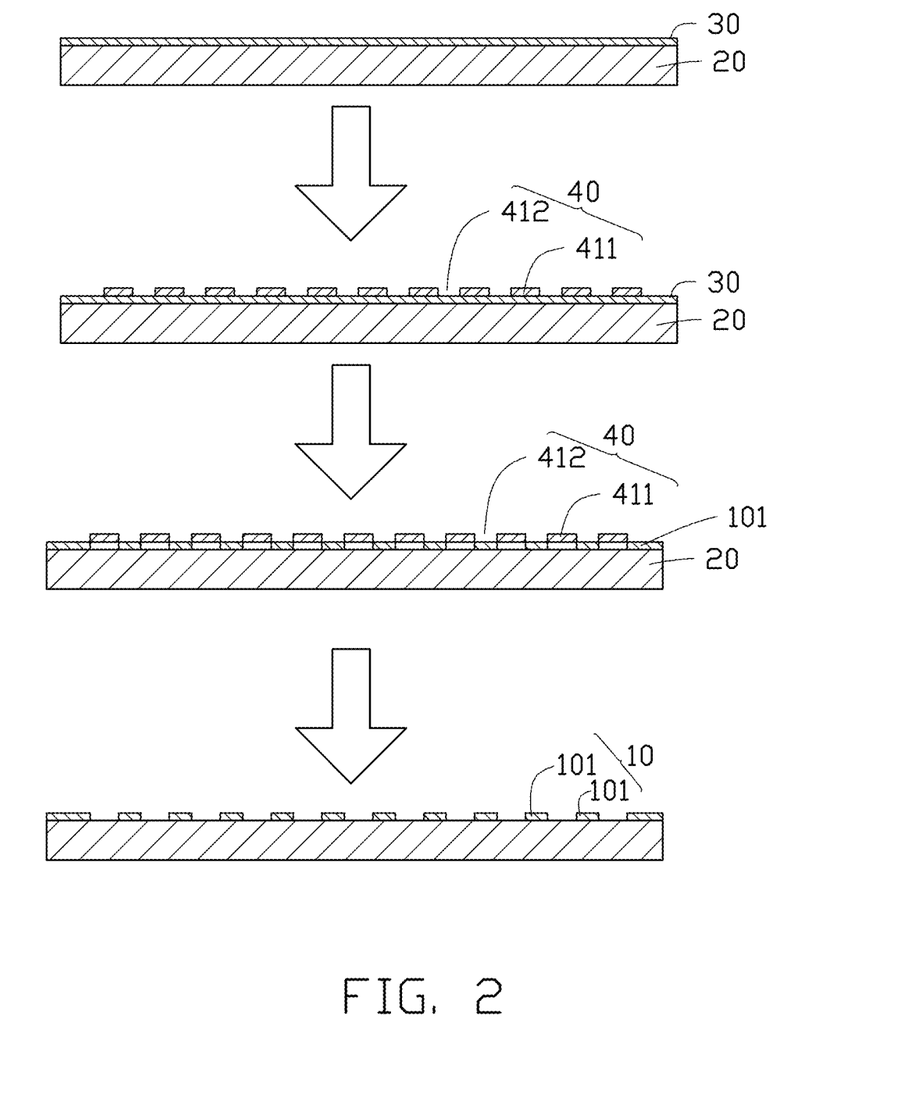
FIG. 2 shows a number of cross-sectional views of the method for making the strip shaped graphene layer in FIG. 1.
Figure 3:
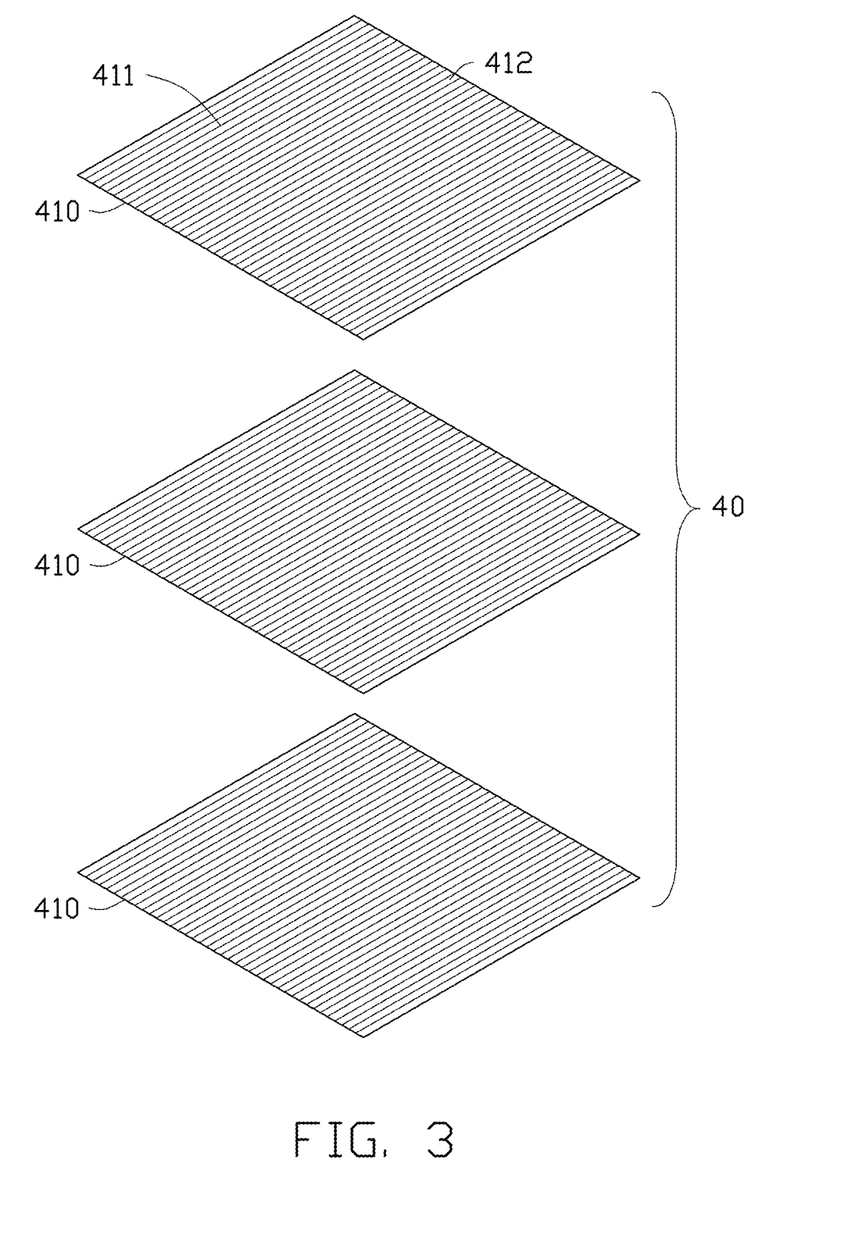
FIG. 3 is a structural view of a carbon nanotube structure used in the method of FIG. 1.

Referring to FIG. 1, FIG. 2 and FIG. 3, one embodiment of a method for making a strip shaped graphene layer 10 includes:

S1, providing a graphene film 30 on a surface of a substrate 20;

S2, adhering a carbon nanotube structure 40 on the graphene film 30, wherein the carbon nanotube structure 40 includes at least one drawn carbon nanotube film 410 comprising a plurality of carbon nanotube segments 411, each of the plurality of carbon nanotube segments 411 being substantially parallel to each other and separated from each other by a strip-shaped gap 412;

S3, applying a voltage to the carbon nanotube film structure 40 and adjusting the temperature of the substrate 20 to remove parts of the graphene film 30 contacting the carbon nanotube segments 411; and S4, separating the carbon nanotube structure 40 with the strip shaped graphene layer 10.

In step S1, the substrate 20 can be a metal substrate with a thickness in a range from about 100 nanometers to about 100 micrometers. A material of the metal foil can be copper or nickel. A shape of the substrate 20 is not limited. An area of the substrate 20 can be set according to the volume of the chamber used to grow the graphene film 30 by the chemical vapor deposition (CVD) method. The substrate 20 can be rolled up and placed in the chamber to grow the graphene film 30 with a large area. In one embodiment, the substrate 20 is a copper foil with a thickness of about 25 micrometers.

In step S1, the graphene film 30 is obtained by a CVD method, the CVD method includes the steps of:

S11, placing the metal substrate in a reacting chamber;

S12, heating the metal substrate to a predetermined temperature; and

S13, flowing a carbon source gas into the reacting chamber, thereby forming the graphene film 30 on a surface of the metal substrate.

In step S11, the reacting chamber can provide a reaction space for forming the graphene film 30. The reacting chamber can have a sealed cavity. The reacting chamber includes a gas inlet and a gas outlet. The gas inlet is used to input a reaction gas. The gas outlet is connected with an evacuating device. The evacuating device can be used to adjust the pressure in the reacting chamber. Furthermore, the reacting chamber can include a water cooling device to adjust the temperature in the reacting chamber. The reacting chamber can be a quartz tube furnace. An area of the metal substrate can be adjusted according to the volume of the reacting chamber. The metal substrate with a relatively large area can be bent or curved so that it can be placed in the reacting chamber.

In step S12, the surface of the metal substrate is heated to become more flat. The flatter the surface of the metal substrate, the easier it is to form the graphene film 30 on the surface of the metal substrate. The reacting chamber is evacuated before heating the metal substrate. In one embodiment, hydrogen gas can be imported in the reacting chamber through the gas inlet before heating the metal substrate. The hydrogen gas can reduce an oxide layer on the surface of the metal substrate, and can further prevent the metal substrate from oxidizing. A flow rate of the hydrogen gas can be in a range from about 2 standard cubic centimeters per minute (sccm) to about 35 sccm. A heating temperature can be in a range from about 800° C. to about 1500° C. A heating period can be in a range from about 20 minutes to about 60 minutes. A pressure in the reacting chamber can be in a range from about 0.1 Pa to about 100 Pa. In one embodiment, the flow rate of the hydrogen gas is about 2 sccm, the pressure of the reacting chamber is about 13.3 Pa, the heating temperature is about 1000° C., a temperature rising period is about 40 minutes, and the constant temperature period at the heating temperature is about 20 minutes.

In step S13, carbon atoms can be deposited on the surface of the metal substrate, thereby forming the graphene film composed of carbon atoms. The hydrogen gas is continuously imported through the gas inlet in step S13 during the process of growing the graphene film. The flow rate of the hydrogen gas, while supplying the carbon source gas into the reacting chamber, is the same as the flow rate in the step S12. A ratio between the flow rate of the carbon source gas and the hydrogen gas is in a range from about 45:2 to about 15:2. The carbon source gas can be at least one of methane, ethane, ethylene, and acetylene. While supplying the carbon source gas, the temperature in the reacting chamber can be in a range from about 800° C. to about 1500° C. with a constant temperature period in a range from about 10 minutes to about 60 minutes. A pressure in the reacting chamber can be in a range from about $10^{-1}$ Pa to about $10^2$ Pa. In one embodiment, the pressure of the reacting chamber is about 66.5 Pa, the temperature of the reacting chamber is about 1000° C., the flow rate of the carbon source gas is about 25 sccm, the carbon nanotube gas is methane, and the constant temperature period is about 30 minutes.

In step S13, the metal substrate can be cooled after forming the graphene film 30 thereon. While cooling the metal substrate, the carbon source gas and the hydrogen gas can be continuously flowed into the reacting chamber. The flow rate of the carbon source gas and the hydrogen gas and the pressure of the reacting chamber are constant. In one embodiment, the metal substrate is cooled for about 1 hour. After cooling the metal substrate, the metal substrate with the graphene film 30 grown thereon is taken out of the reacting chamber.

The graphene film 30 is a two dimensional film structure. A thickness of the graphene film 30 can be in a range from about 0.34 nanometers to about 10 nanometers. The graphene film 30 has a high transmittance of about 97.7%. A heat capacity of the graphene film 30 can be less than $2 \times 10^{-3}$ J/cm$^2$·K. In one embodiment, the heat capacity of the graphene film 30 having one graphene layer is less than $5.57 \times 10^{-4}$ J/cm$^2$·K. The graphene film 30 can be a free-standing structure. The term "free-standing structure" means that the graphene film 30 can sustain the weight of itself when it is hoisted by a portion thereof without any significant damage to its structural integrity. If the graphene film 30 is placed between two separate supports, a portion of the graphene film 30 not in contact with the two supports would be suspended between the two supports and yet maintain structural integrity.

It is understood that carbon atoms can also be deposited on the other surface of the metal substrate, thereby forming another graphene film (not shown in FIG. 2) on the other surface. Alternatively, another graphene film on the other surface can be removed in some embodiments by polishing. Step S13 can further include a step of polishing the other surface of the metal substrate.

Figure 4:
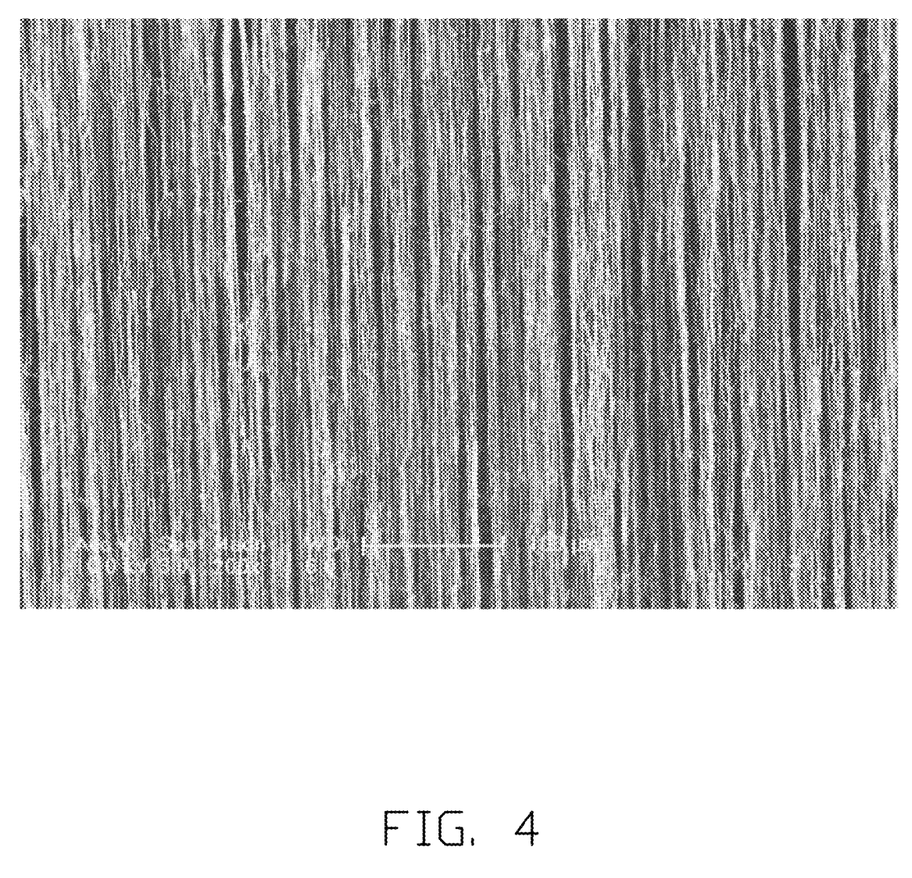
FIG. 4 is a scanning electron microscopic (SEM) image of a drawn carbon nanotube film of the carbon nanotube structure in FIG. 3.

In step S21, the graphene film 30 is sandwiched between the carbon nanotube structure 40 and the substrate 20. The carbon nanotube structure 40 can include one drawn carbon nanotube film 410 or a plurality of drawn carbon nanotube films 410 stacked with each other. Referring to FIG. 3, in one embodiment, carbon nanotube structure 40 includes three of the drawn carbon nanotube films 410 stacked with each other, and the carbon nanotubes in each of the drawn carbon nanotube films 410 are aligned along a same direction. Referring to FIG. 4, the drawn carbon nanotube film 410 includes the plurality of carbon nanotube segments 411 substantially parallel to each other, and the plurality of strip-shaped gaps 412 between adjacent ones of the carbon nanotube segments 411. Each of the plurality of carbon nanotube segments 411 includes a plurality of successive and oriented carbon nanotubes joined end-to-end by van der Waals attractive force therebetween. Thus, the carbon nanotubes in the drawn carbon nanotube film 410 are aligned along a same direction and substantially parallel to a surface of the drawn carbon nanotube film 410. A thickness of the drawn carbon nanotube film 410 can be in a range from about 0.5 nanometers to about 100 micrometers. A width of the plurality of strip-shaped gaps 412 can range from about 10 nanometers to about 100 nanometers.

Figure 5:
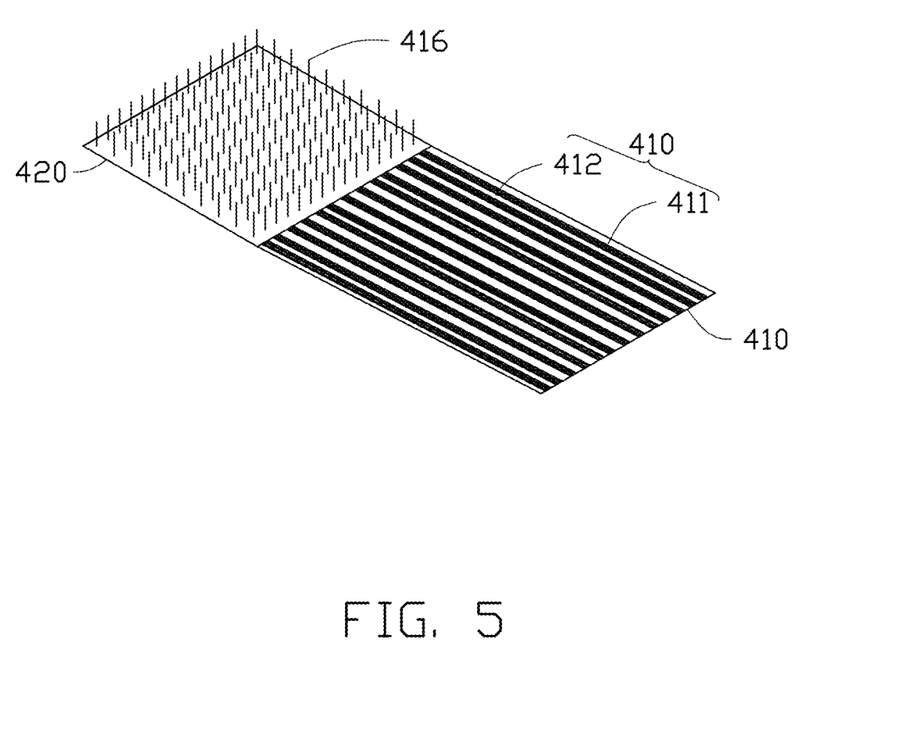
FIG. 5 is a schematic view of a method for making the drawn carbon nanotube film in FIG. 4.

Referring to FIG. 5, the drawn carbon nanotube film 410 can be formed by drawing a film from a carbon nanotube array 416 that is capable of having a film drawn therefrom by using a pulling/drawing tool.

The carbon nanotube array 416 can be formed by a CVD method. The carbon nanotube array 416 is formed on a substrate, and includes a plurality of carbon nanotubes substantially perpendicular to the surface of the substrate. The carbon nanotubes together form the carbon nanotube array 416 located on the surface of the substrate. The carbon nanotube array 416 is essentially free of impurities such as carbonaceous or residual catalyst particles. The carbon nanotubes in the carbon nanotube array 416 are closely packed together by van der Waals attractive force. Accordingly, the drawn carbon nanotube film 410 can be drawn from the carbon nanotube array 416. The length of the carbon nanotubes can be approximately 50 microns to approximately 5 millimeters. In one embodiment, the length of the carbon nanotubes can be approximately ranged from 100 microns to 900 microns. The method for growing the carbon nanotube array 416 is disclosed by patent application US20080248235 to Feng et al.

The pulling/drawing tool can be adhesive tape, pliers, tweezers, or any tool capable of gripping and simultaneously pulling multiple carbon nanotubes. The drawn carbon nanotube film 410 can be pulled/drawn out from the carbon nanotube array 416 by the following steps:

selecting the carbon nanotube segments 411 having a predetermined width from the carbon nanotube array 416; and pulling the carbon nanotube segments 411 at an even/uniform speed to achieve the drawn carbon nanotube film 410 which is uniform.

The carbon nanotube array 416 is capable of having a film drawn therefrom. The carbon nanotube segments 411 having a predetermined width can be selected by using an adhesive tape such as the pulling/drawing tool to contact the carbon nanotube array 416. The carbon nanotube segments 411 include a plurality of carbon nanotubes substantially parallel to each other. The pulling direction is arbitrary (e.g., substantially perpendicular to the growing direction of the carbon nanotube array).

Specifically, during the pulling/drawing process, as the initial carbon nanotube segments 411 are drawn out, other carbon nanotube segments 411 are also drawn out end-to-end due to the van der Waals attractive force between ends of adjacent segments. In general, the initially selected carbon nanotubes are drawn out from the carbon nanotube array 416 by the moving of the drawing tool. The following carbon nanotubes adjacent to the initially selected carbon nanotubes are then drawn out by van der Waals attractive force between the following carbon nanotubes and the initially selected carbon nanotubes thereby forming the drawn carbon nanotube film 410 with the carbon nanotubes joined end-to-end by van der Waals attractive force therebetween. This process of drawing ensures that a continuous, uniform, and free-standing drawn carbon nanotube film 410 having a predetermined width can be formed.

A width of the drawn carbon nanotube film 410 depends on the size of the carbon nanotube array 416. A length of the drawn carbon nanotube film 410 is arbitrary. In one embodiment, if the size of the substrate is 4 inches, the width of the drawn carbon nanotube film 410 is in the approximate range from 1 centimeter to 10 centimeters, and the thickness of the drawn carbon nanotube film 410 is in the approximate range from 0.01 microns to about 100 microns.

The carbon nanotube structure 40 can be formed by the following steps:

providing a frame and adhering first one of the drawn carbon nanotube films 410 to the frame and removing the excess film outside the frame;

adhering second one of the drawn carbon nanotube films 410 to the frame to overlap the first one drawn carbon nanotube film 410, wherein the carbon nanotubes of the first one and the second drawn carbon nanotube films 410 are aligned a long a same direction ; and repeating the above steps thereby forming the carbon nanotube structure 40.

For example, two or more such drawn carbon nanotube films 410 can be stacked on each other on the frame to form the carbon nanotube structure 40. The carbon nanotubes in every two adjacent drawn carbon nanotube films 410 are aligned along a same direction.

Because the drawn carbon nanotube film 410 includes the plurality of strip-shaped gaps 411 between adjacent one of the carbon nanotube segments 411, the strip-shaped gaps 412 of the adjacent drawn carbon nanotube films 410 can stack with each other in the carbon nanotube structure 40. The width of the plurality of strip-shaped gaps 412 in the carbon nanotube structure 40 can be controlled by adjusting the number of the stacked drawn carbon nanotube films 410. The width of the plurality of strip-shaped gaps 412 can range from about 10 nanometers to about 100 nanometers. In one embodiment, the width of the plurality of strip-shaped gaps 412 is in a range from about 50 nanometers to about 80 nanometers.

To increase the dimension of the strip-shaped gaps 412 in the carbon nanotube structure 40, the carbon nanotube structure 40 can be treated with an organic solvent.

The carbon nanotube structure 40 can, beneficially, be treated by either of two methods: dropping the organic solvent from a dropper to soak the entire surface of the carbon nanotube structure 40 fixed on a frame or a surface of a supporter, or immersing the frame with the carbon nanotube structure 40 thereon into a container having an organic solvent therein. After being soaked by the organic solvent, the carbon nanotube segments 411 in the drawn carbon nanotube film 410 of the carbon nanotube structure 40 can at least partially shrink and collect or bundle together.

The carbon nanotubes in the drawn carbon nanotube film 410 of the carbon nanotube structure 40 are joined end to end and aligned along a same direction, thus the carbon nanotube segments 411 would shrink in a direction perpendicular to the orientation of the carbon nanotubes. If the drawn carbon nanotube film 410 is fixed on a frame or a surface of a supporter or a substrate, the carbon nanotube segments 411 would shrink into several large carbon nanotube bundles. A distance between the adjacent large carbon nanotube bundles is increased after the above treatment. As such, the dimension of the strip-shaped gaps 412 is increased and can be in a range from about 2 micrometers to about 200 micrometers. Due to the decrease of the specific surface via bundling, the coefficient of friction of the carbon nanotube structure 40 is reduced, but the carbon nanotube structure 40 maintains high mechanical strength and toughness.

The organic solvent is volatilizable and can be ethanol, methanol, acetone, dichloroethane, chloroform, or any combinations thereof.

To increase the dimension of the strip-shaped gaps 412 in the carbon nanotube structure 40, the drawn carbon nanotube films 410 can be treated by a laser beam before stacking with each other to form the carbon nanotube structure 40.

The laser beam treating method includes fixing the drawn carbon nanotube film 410 and moving the laser beam at an even/uniform speed to irradiate the drawn carbon nanotube film 410, thereby increasing the width of the plurality of strip-shaped gaps 412. A laser device used in this process can have a power density greater than $0.1 \times 10^4$ W/m$^2$.

The laser beam is moved along a direction in which the carbon nanotubes are oriented. The carbon nanotubes absorb energy from laser irradiation and the temperature thereof is increased. Some of the carbon nanotubes in the drawn carbon nanotube film 410 will absorb more energy and be destroyed. When the carbon nanotubes along the orientation of the carbon nanotubes in the drawn carbon nanotube film 410 are destroyed due to absorbing too much energy from the laser irradiation, the width of the strip-shaped gaps 412 can be in a range from about 2 micrometers to about 200 micrometers.

In step S21, the carbon nanotube structure 40 can be put on the graphene film 30 and cover the graphene film 30. The carbon nanotube structure 40 and the graphene film 30 can be stacked together by mechanical force.

In step S21, because the drawn carbon nanotube film 410 has a good adhesive property, the plurality of drawn carbon nanotube films 410 can be directly located on the graphene film 30 step by step along a same direction. Therefore, the carbon nanotube structure 40 is formed directly on the graphene film 30, and the carbon nanotube segments 411 are contacted to the graphene film 30 firmly. Furthermore, an organic solvent can be dropped on the carbon nanotube structure 40 to increase the dimension of the strip-shaped gaps 412 in the carbon nanotube structure 40.

Figure 6:
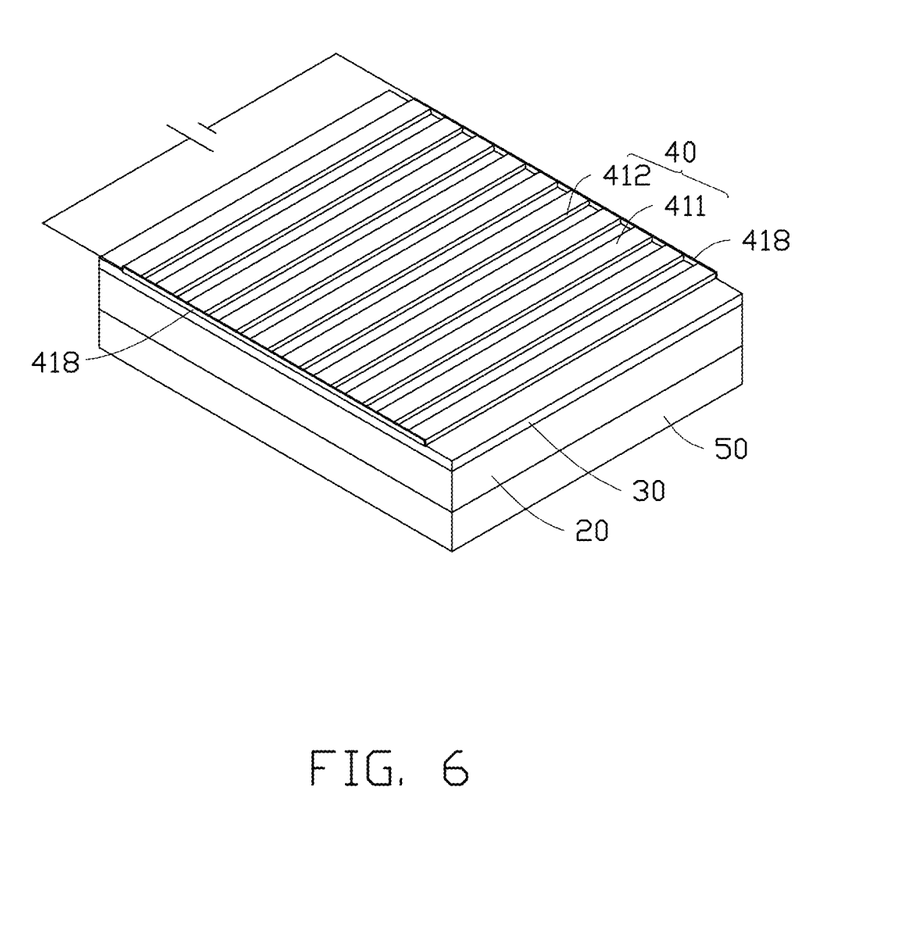
FIG. 6 is a schematic view of the step S3 of the method in FIG. 1.

Referring to FIG. 6, in step S3, two strip electrodes 418 are located separately at two opposite sides of the carbon nanotube structure 40 substantially parallel to each other, to apply a voltage. A heating device 50 is provided to heat the substrate 20. The heating device 50 is contacted to the substrate 20 and can heat the substrate 20. The heat of the heating device 50 can transfer from the substrate 20 to the graphene film 30 located on the substrate 20. The graphene film 30 can be heated uniformly by the heating device 50. The two strip electrodes 418 are substantially perpendicular to the alignment direction of the carbon nanotubes in the drawn carbon nanotube structure 40. A voltage is applied to the carbon nanotube structure 40 via the two strip electrodes 418 for several minutes. Because carbon nanotubes have high electric conversion efficiency, the temperature of the carbon nanotube structure 40 can increase from 100° C. to about 600° C. within the above time frame. The temperature of the substrate 20 can be controlled by the heating device 50, and the graphene film 30 can be heated by adjusting the temperature of the substrate 20. The carbon nanotube segments 411 are contacting the graphene film 30, and heat can be transferred from the carbon nanotube structure 40 via the carbon nanotube segments 411 to the graphene film 30. The parts of the graphene film 30 exposed out of the strip-shaped gaps 412 will not absorb less heat transferred from the carbon nanotube segments 411. Therefore, the parts of the graphene film 30 contacting the carbon nanotube segments 411 will absorb more heat than the parts of the graphene film 30 exposed out of the strip-shaped gaps 412, thus the parts of the graphene film 30 contacting the carbon nanotube segments 411 are removed. Parts of the graphene film 30 exposed out of the strip-shaped gaps 412 remain, and the strip shaped graphene 10 is obtained.

In one embodiment, the voltage applied on the carbon nanotube structure 40 is in a range from about 1 volt to about 20 volts. The time of applying the voltage is in a range from about 5 seconds to about 3 minutes. In one embodiment, the voltage is 4.5 volts and the time is 30 seconds In step S4, to separate the remained the carbon nanotube structure 40 with on the strip shaped graphene layer 10, an ultrasonic treating process is provided. The duration of the ultrasonic treating process can be in a range from about 3 minutes to about 30 minutes. In one embodiment, the carbon nanotube structure 40 on the substrate 20 is treated by ultrasonic after step S3, and the duration of the ultrasonic treating process is 10 minutes.

Figure 7:
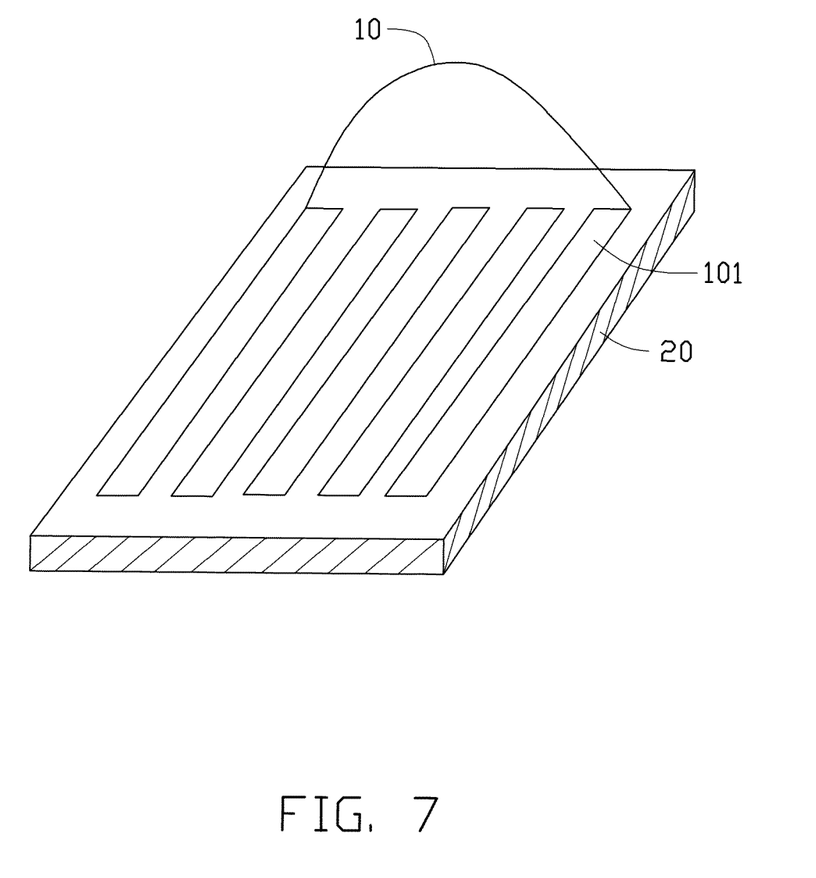
FIG. 7 is a schematic view of one embodiment of a strip shaped graphene layer obtained by the method of FIG. 1.
Figure 8:
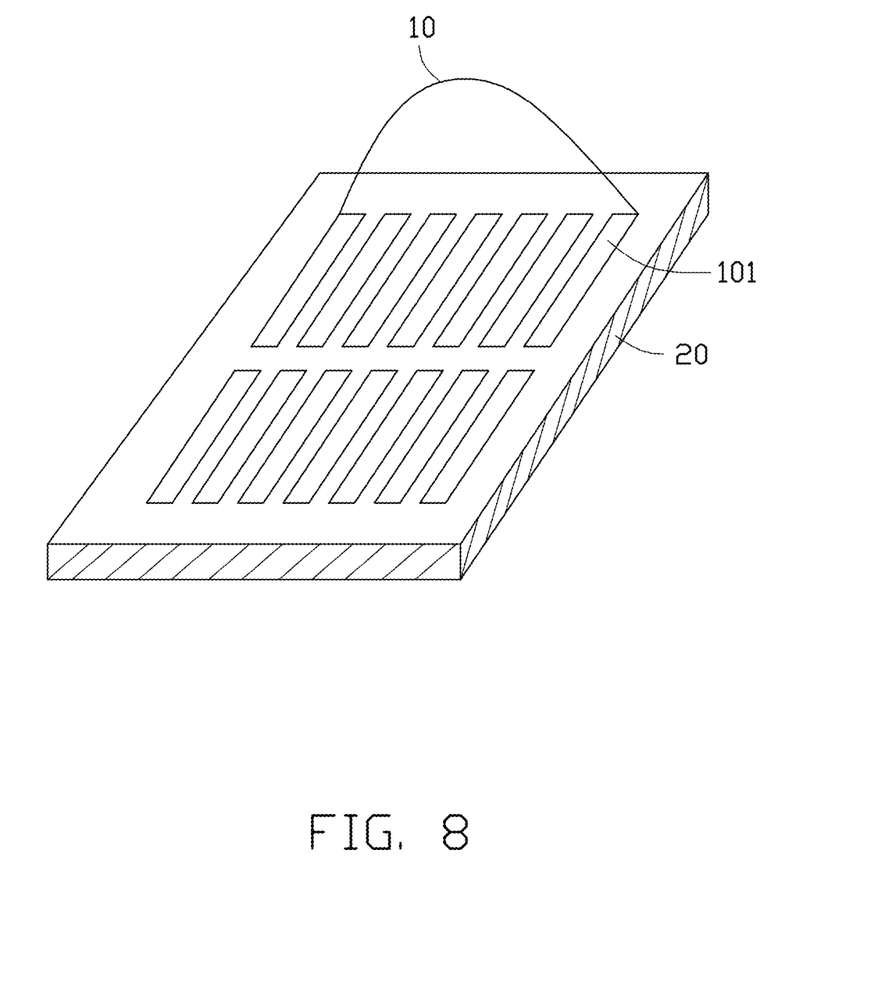
FIG. 8 is a schematic view of another embodiment of a strip shaped graphene layer obtained by the method of FIG. 1.

As shown in FIG. 7 and FIG. 8, a strip shaped graphene layer 10 is located on the substrate. The strip shaped graphene layer 10 includes a plurality of graphene strips 101 aligned along a same direction and substantially parallel to each other. The strip shaped graphene layer 10 can be used as conductive layers in semi-conductive devices.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method for making a strip shaped graphene layer comprising:
    S1, providing a graphene film on a surface of a metal substrate;
    S2, adhering a carbon nanotube structure on the graphene film, wherein the carbon nanotube structure comprises at least one drawn carbon nanotube film comprising a plurality of carbon nanotube segments, each of the plurality of carbon nanotube segments is parallel to each other and separated from each other by a strip-shaped gap, and there is at least one strip-shape gap;
    S3, applying a voltage to the carbon nanotube structure and adjusting a temperature of the metal substrate to remove parts of the graphene film contacted with the carbon nanotube segments, wherein parts of the graphene film exposed out of the at least one strip-shaped gap remain, and the strip shaped graphene is obtained; and
    S4, separating the carbon nanotube structure from the strip shaped graphene layer.

2. The method of claim 1, wherein in step S1, the metal substrate has a thickness in a range from about 100 nanometers to about 100 micrometers.

3. The method of claim 2, wherein the metal substrate is made of copper or nickel.

4. The method of claim 1, wherein a width of the at least one strip-shaped gap is in a range from about 20 nanometers to about 80 nanometers.

5. The method of claim 1, wherein the at least one drawn carbon nanotube film of the carbon nanotube structure comprises a plurality of drawn carbon nanotube films stacked with each other.

6. The method of claim 5, wherein each of the plurality of drawn carbon nanotube films is made by:
    providing a carbon nanotube array;
    selecting a carbon nanotube segment having a predetermined width from the carbon nanotube array; and
    pulling the carbon nanotube segment at a uniform speed to form one of the at least one drawn carbon nanotube films which is uniform.

7. The method of claim 1, wherein in step S3, the voltage is applied to the carbon nanotube structure by attaching two strip electrodes parallel to each other and perpendicular to the plurality of carbon nanotube segments, and a temperature of the plurality of carbon nanotube segments increases as the voltage is applied.

8. The method of claim 7, wherein in step S3, the parts of the graphene film contacting the plurality of carbon nanotube segments are heated by the plurality of carbon nanotube segments.

9. The method of claim 8, wherein in step S3, a heating device is provided to heat the substrate, and heat is transferred from the substrate to the graphene film.

10. The method of claim 9, wherein parts of the graphene film contacting the plurality of carbon nanotube segments absorb more heat than the parts of the graphene film exposed out of the at least one strip-shaped gap.

11. The method of claim 10, wherein the parts of the graphene film contacting the plurality of carbon nanotube segments are removed, and the parts of the graphene film exposed out of the at least one strip-shaped gap are maintained.

12. The method of claim 1, wherein in step S4, the carbon nanotube structure is separated with the strip shaped graphene layer by an ultrasonic treating process.

13. The method of claim 12, wherein a duration of the ultrasonic treating process is in a range from about 3 minutes to about 30 minutes.

14. A method for making a strip shaped graphene layer comprising:
    S1, providing a graphene film on a surface of a metal substrate;
    S2, adhering a carbon nanotube structure on the graphene film, wherein the carbon nanotube structure comprises at least one drawn carbon nanotube film comprising a plurality of carbon nanotube segments, each of the plurality of carbon nanotube segments is parallel to each other and separated from each other by a strip-shaped gap, and there is at least one strip-shaped gap; and
    S3, applying a voltage to the carbon nanotube structure and adjusting a temperature of the metal substrate to remove parts of the graphene film contacting the carbon nanotube segments, wherein parts of the graphene film exposed out of the at least one strip-shaped gap remain, and the strip shaped graphene is obtained.

15. The method of claim 14, wherein in step S1, the metal substrate has a thickness in a range from about 100 nanometers to about 100 micrometers.

16. The method of claim 15, wherein the metal substrate is made of copper or nickel.

17. The method of claim 14, wherein a width of the at least one strip-shaped gap is in a range from a-bout 20 nanometers to about 80 nanometers.

18. The method of claim 14, wherein the at least one drawn carbon nanotube film of the carbon nanotube structure comprises a plurality of drawn carbon nanotube films stacked with each other.

19. The method of claim 18, wherein each of the plurality of drawn carbon nanotube films is made by steps of:
 providing a carbon nanotube array;
 selecting a carbon nanotube segment having a predetermined width from the carbon nanotube array; and
 pulling the carbon nanotube segment at a uniform speed to form one of the at least one drawn carbon nanotube films which is uniform.

20. The method of claim 14, wherein parts of the graphene film exposed out of the at least one strip-shaped gap is maintained.

* * * * *